(12) United States Patent
Laackmann et al.

(10) Patent No.: US 7,533,307 B2
(45) Date of Patent: May 12, 2009

(54) METHOD AND CIRCUIT ARRANGEMENT FOR OPERATING A VOLATILE RANDOM ACCESS MEMORY AS A DETECTOR

(75) Inventors: Peter Laackmann, Munich (DE); Marcus Janke, Munich (DE)

(73) Assignee: Infineon Technologies AG (DE)

( * ) Notice: Subject to any disclaimer, the term of this patent is extended or adjusted under 35 U.S.C. 154(b) by 428 days.

(21) Appl. No.: 11/556,760

(22) Filed: Nov. 6, 2006

(65) Prior Publication Data

US 2007/0297217 A1    Dec. 27, 2007

(30) Foreign Application Priority Data

Jun. 23, 2006   (DE) ................... 10 2006 028 943

(51) Int. Cl.
  *G06F 11/00*    (2006.01)
(52) U.S. Cl. ...................... 714/708; 714/766
(58) Field of Classification Search ................ 365/201, 365/200; 711/103; 714/764, 773, 708, 766
  See application file for complete search history.

(56) References Cited

U.S. PATENT DOCUMENTS

| | | | | |
|---|---|---|---|---|
| 4,758,992 | A | * | 7/1988 | Taguchi ...................... 365/222 |
| 6,065,146 | A | * | 5/2000 | Bosshart ..................... 714/754 |
| 6,560,725 | B1 | * | 5/2003 | Longwell et al. .............. 714/54 |
| 2002/0004921 | A1 | | 1/2002 | Muranaka et al. |
| 2003/0051094 | A1 | * | 3/2003 | Katayama et al. ........... 711/103 |

* cited by examiner

*Primary Examiner*—David Ton
(74) *Attorney, Agent, or Firm*—Dickstein, Shapiro, LLP.

(57) ABSTRACT

A method for operating a volatile random access memory as a detector, with predetermined information being stored in at least one area of the volatile random access memory. The method includes interrupting a supply voltage for the at least one area of the random access memory during a time period, reading information from the at least one area of the random access memory, and checking the extent to which the predetermined information and the information that has been read match or whether the predetermined information and the information which has been read have a predetermined relationship.

39 Claims, 4 Drawing Sheets

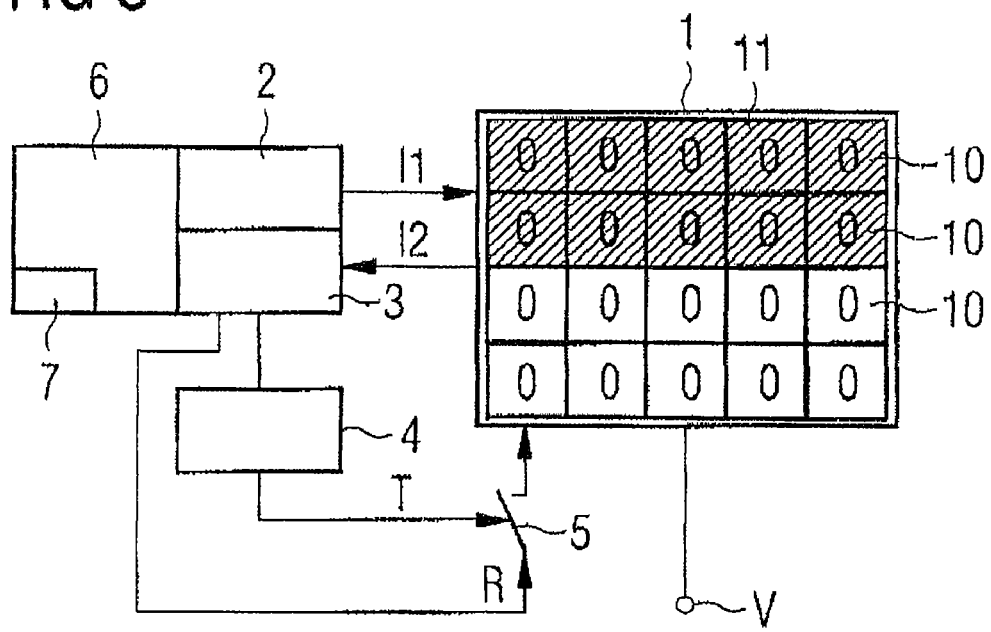
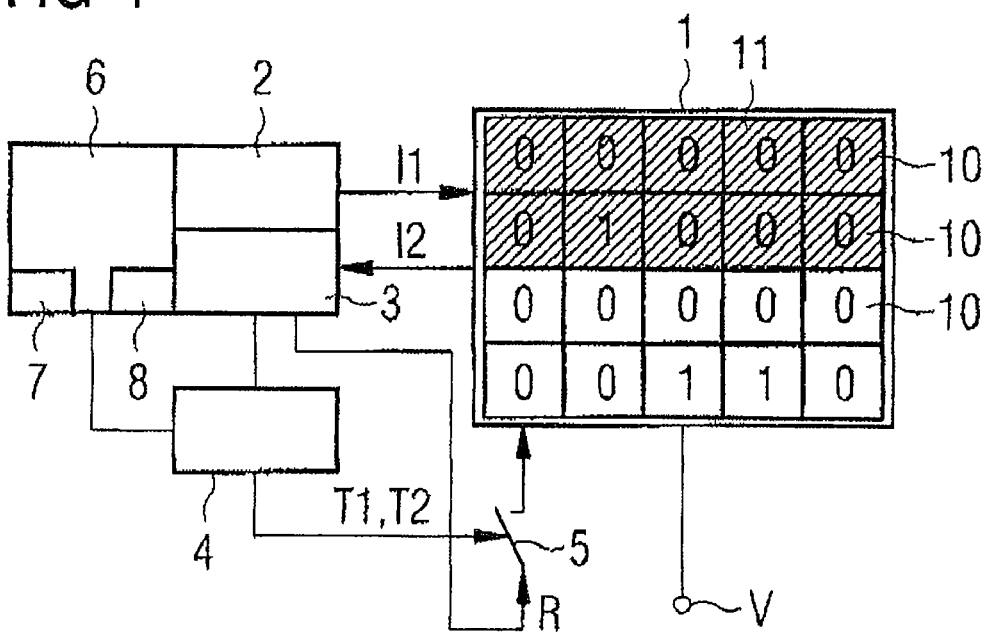

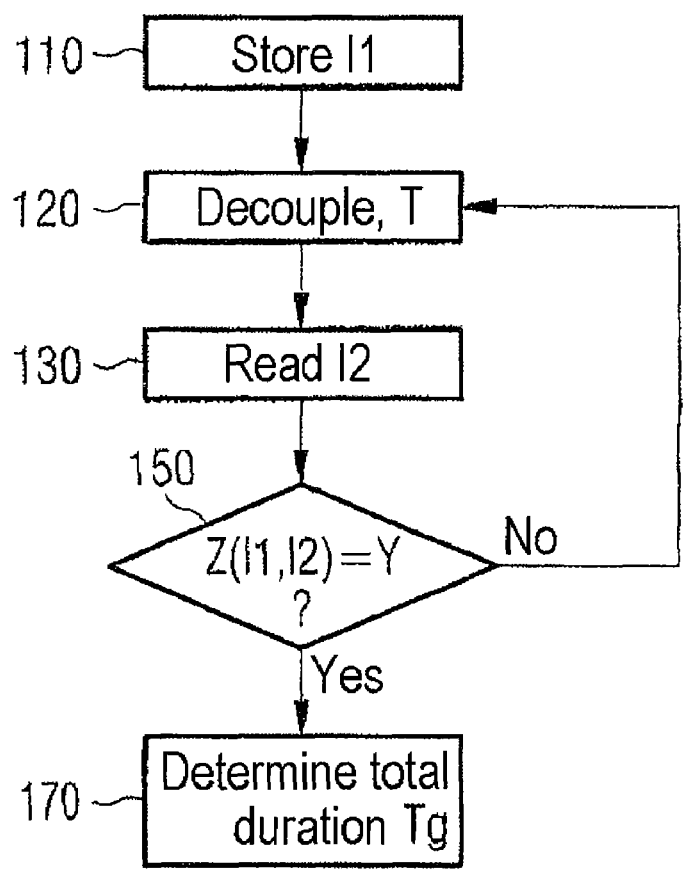

METHOD AND CIRCUIT ARRANGEMENT FOR OPERATING A VOLATILE RANDOM ACCESS MEMORY AS A DETECTOR

CROSS-REFERENCE TO RELATED APPLICATION

This application claims priority to German Patent Application Serial No. 102006028943.9, which was filed Jun. 23, 2006, and is incorporated herein by reference in its entirety.

FIELD OF THE INVENTION

The invention relates to a method for operation of a volatile random access memory as a detector, and to a circuit arrangement for operation of a volatile random access memory as a detector.

BACKGROUND OF THE INVENTION

During operation of a circuit arrangement, for example of a security controller, it is also possible to monitor environmental parameters, in order to check whether the environmental parameters are possibly acting on the circuit arrangement in such a manner that the internal functional operation of the circuit arrangement could be disturbed. One example of environmental parameters such as these is very high or very low temperatures, which could disturb the functional operation. For this purpose, the temperature of the chip in which the circuit arrangement is arranged is normally monitored during operation.

This monitoring is used to ensure the functional reliability of the circuit arrangement. When an increased or decreased temperature is detected which is outside the normal operating range, the operation of the chip can be prevented or stopped.

Conventionally, the chip temperature is monitored by means of analog sensors. However, these sensors have the disadvantage that the chip area which is used and required for them is relatively large. This is contrary to the miniaturization of chips, since this chip area is no longer available for other functions.

The requirement for the invention results from these and other reasons.

SUMMARY OF THE INVENTION

One aspect of the invention provides a method for operating a volatile random access memory as a detector, with predetermined information being stored in at least one area of the volatile random access memory. The method includes interrupting a supply voltage for the at least one area of the random access memory during a time period, reading information from the at least one area of the random access memory, and checking the extent to which the predetermined information and the information that has been read match or whether the predetermined information and the information which has been read have a predetermined relationship.

A further aspect of the invention provides a method which comprises the following steps:

interruption of the provision of a refresh signal retaining information for the at least one area of the random access memory during a time period, reading of information from the at least one area of the random access memory, and checking the extent to which the predetermined information and the information that has been read match or whether the predetermined information and the information which has been read have a predetermined relationship.

BRIEF DESCRIPTION OF THE DRAWINGS

Exemplary embodiments of the invention can be understood better with reference to the following drawings.

FIG. 3 shows a third exemplary embodiment of a circuit arrangement.

FIG. 4 shows a fourth exemplary embodiment of a circuit arrangement.

FIG. 7 shows a third method example.

DETAILED DESCRIPTION OF THE INVENTION

Figure 1:
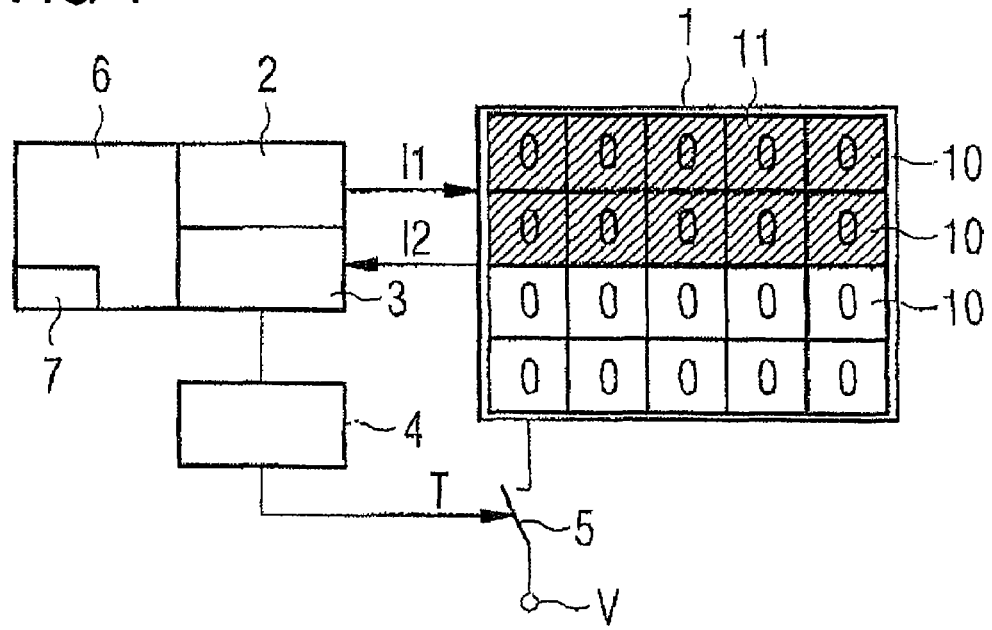
FIG. 1 shows a first exemplary embodiment of a circuit arrangement.

In one exemplary embodiment of the method, a static RAM, or a so-called SRAM, is used as a detector, in which the stored information disappears when the supply voltage is decoupled.

In a further exemplary embodiment of the method, a dynamic RAM, or DRAM, is used as a detector. A signal in order to retain information, also referred to as a refresh signal, is provided for the dynamic RAM in order to control regular refreshing (which is a fundamental requirement for this memory type) of the memory content by memory-internal circuits. If the provision of the signal is interrupted, the refreshing process ceases, and the stored information disappears.

These exemplary embodiments have the advantage that there is no need for any analog sensors since the volatile random access memory is used as a detector in addition to its function for data processing. The volatility of the stored information when the supply voltage is interrupted is used as a yardstick for environmental conditions. Switching off the supply voltage in general does not lead to sudden, total loss of data, but the binary value of a bit is no longer stable and can change. This process is also referred to as "flipping". The probability of this increases as the time period since the interruption of the voltage supply increases, so that an increasing number of bits will flip. In consequence, the stored information is gradually lost. The rate at which the information is lost depends on environmental parameters. For example, it depends on the temperature and on radiation, such as X-ray radiation. The degree of interaction between these environmental parameters also affects the information loss.

The comparison of the stored information with the information which has been read after a predetermined time period allows conclusions to be drawn about the environmental parameters which are acting on the loss of information.

By way of example, in one exemplary embodiment, a check is carried out to determine whether the predetermined information and the information which has been read are the same. This comparison can be carried out in a simple manner.

In one advantageous refinement, the interruption, reading and checking are repeated until the predetermined information and the information which has been read have a predetermined relationship. This makes it possible to determine the time period before, for example, half of the stored information has been changed. The measured overall time duration is compared with a predetermined time period. This refinement of the method is more accurate. Significant deviations from the predetermined time period lead to the deduction of a major increase or decrease in the temperature.

For accurate determination of the overall time period, the time periods for the repeated interruption steps can be varied in order, for example, to sample as accurately as possible the predetermined relationship, for example before half of the stored bits have flipped, as the interruption steps become increasingly smaller.

In one alternative refinement, the storage for each iteration is also repeated. In this embodiment, the duration of the time period during which the supply voltage is decoupled is varied for each interruption step. This method is particularly accurate because random flipping of bits between two interruption steps does not adversely affect the measurement.

In one advantageous method embodiment, an alarm action is initiated if the overall time period for the procedures described above is outside a predetermined range. This alarm action may, for example, comprise the operation of the circuit arrangement being stopped, or registers being deleted.

The predetermined information advantageously comprises a binary data sequence. The Hamming distance between the predetermined information and the information which has been read is determined during the check. In this case, it is advantageous to check whether the Hamming distance is in a predetermined range. Undershooting of the range leads to the deduction that the temperature is too low. Overshooting of the range leads to the detection that the temperature is greatly increased.

The circuit arrangement includes a volatile random access memory and an access device which is coupled to the random access memory and which is designed to store predetermined information in at least one area of the random access memory and which is also designed to read information from the at least one area of the random access memory. The circuit arrangement also comprises a switching device which is designed to decouple the at least one area of the random access memory from a supply voltage for a time period or to deactivate the provision of a signal for retaining information in the at least one area of the random access memory, for the random access memory during a time period, as well as a comparison device which is coupled to the access device and is designed to check the extent to which the predetermined information and the information which has been read match, or to check whether the predetermined information and the information which has been read have a predetermined relationship, which is provided by a provision means.

The deactivation can be carried out by a deactivation means, which decouples the signal retaining information from the random access memory or suppresses the signal retaining information.

The advantage of these circuit arrangements is that the volatile random access memory is used as a detector in addition to and at the same time as its memory function, so that there is no need to provide any detectors in addition to this.

In one typical refinement of the circuit arrangement with a security controller, which also comprises a central processing device, or CPU, and peripheral modules, the volatile random access memory is in the form of a so-called RAM (Random Access Memory). During normal operation, the RAM is used as a main memory, in order to provide data for processing.

The comparison device is advantageously designed to detect whether the predetermined information and the information which has been read have a predetermined relationship. The decoupling time period is advantageously predetermined in this case. In the simplest case, this predetermined relationship relates to the information items being identical, that is to say the process detects whether any bit has flipped during the decoupling time period.

In one exemplary embodiment, the circuit device can be designed in such a manner that the entire volatile random access memory can be decoupled, which simplifies the circuitry design. In one alternative refinement, the signal in order to retain information can control the refreshing of the entire volatile random access memory, in the case of DRAM, which can be implemented easily in the circuitry.

In an alternative refinement, the comparison device is coupled to the circuit device in such a manner that the voltage supply is decoupled once or more until the predetermined relationship is satisfied. This procedure has the aim of determining the overall required decoupling duration before the predetermined relationship is satisfied. A relatively long time period is in this case normally considered for detection, so that the accuracy of the detection is increased.

In one advantageous embodiment, the circuit device is designed to initiate an alarm action if the duration during which the voltage supply is decoupled in total is outside a predetermined range. This is because this makes it possible to deduce that the temperature, or the radiation, is greatly increased, or that the temperature is too low.

If provision is made for the voltage supply to be interrupted only once, an alarm action can be initiated if the predetermined relationship, in the simplest case the information items being identical, is not satisfied. This makes it possible to deduce environmental conditions which will adversely affect the functional operation of the circuit.

In the case of the circuit arrangement as well, the determination of the Hamming distance is a suitable means for comparison and assessment of the stored information and the information which has been read.

Exemplary embodiments of the invention will be explained with reference to the drawing in the following text.

As a first exemplary embodiment, FIG. 1 shows a schematic circuit diagram of a circuit arrangement with a volatile random access memory 1. The random access memory 1, which by way of example is in the form of a SRAM, comprises a large number of memory locations 10, in each of which one bit can be stored. For the sake of clarity, the illustration in FIG. 1 is restricted to a very small number of memory locations 10.

Furthermore, the circuit arrangement has an access device with a writing device 2 and a reading device 3. The access device is designed to write predetermined information I1 to the volatile random access memory 1 by means of the writing device 2. The access device is also designed to read information which is provided in the random access memory 1, in this case annotated I2, by means of the reading device 3.

During normal operation, the access device accesses the random access memory such that data is read from it for data processing, or is stored in it. During normal operation, the random access memory is used as a main memory.

The information I1, I2 can be written to all the memory locations 10 in the random access memory 1, or can be written to just one subarea 11, for example of the size of one segment or of one or more word. The subarea 11 is represented by shading in FIG. 1.

During reading, the information I2 is read from the subarea 11 to which the predetermined information I1 has previously been written. The predetermined, stored and read information items I1, I2 are therefore identical, provided that no bits have flipped. This is normally the case, provided that the random access memory 1 is coupled to a voltage supply connection. The supply voltage V can be decoupled by means of a switch 5.

It is also feasible for the random access memory 1 to be designed in such a manner that only the area I1 in which the predetermined information I1 has been stored is decoupled from the supply voltage V. However, the circuitry for this refinement is more complex.

The access device 2, 3 is coupled to a comparison device 6 which is designed to check the extent to which the predetermined information and the information which has been read I1, I2 match or differ. A memory unit 7 is coupled to the access device 6. This is in the form of a means for provision of a predetermined relationship, for example an area within which the difference between the predetermined information and the information which has been read I1, I2 is intended to move.

Furthermore, the circuit arrangement has a switching device 4, in order to drive the switch 5 to interrupt the supply voltage V.

In the exemplary embodiment, the switching device 4 is designed in such a manner that the supply voltage V is decoupled from the random access memory 1 for a time period of predetermined duration T.

In this exemplary embodiment, the switching device 4 is coupled to the access device 2, 3 which controls the switching device 4, such that the supply voltage V is decoupled for the predetermined time period T before the reading of the information I2.

In order to operate the random access memory 1 as a detector, the predetermined information I1 is first of all written to the random access memory 1. By way of example, these are the same bits, "0". However, it is also feasible to use a different predetermined bit pattern, for example a sequence of alternating bits "0" and "1", or a predetermined sequence of bits.

It is also feasible to design the random access memory 1 in such a manner that, at the start of operation, the random access memory 1 is initialized such that a predetermined information pattern, for example comprising only "1" bits, is stored in the random access memory 1. In this case, there is no need for the writing step mentioned above.

No data losses occur provided that the random access memory 1 is coupled to the supply voltage V.

When the power supply is disconnected, or the supply voltage V for the random access memory 1 is decoupled, the stability of the information stored in it is no longer guaranteed. In fact, the stored information disappears as time passes, since an increasing number of bits flip, so as the time since the supply voltage V was decoupled increases, the information disappears on the basis of a random pattern.

When the supply voltage V is coupled to the random access memory 1 again, the bit states which were adopted in the time period T in which the supply voltage V had been decoupled are retained. These states are read by means of the reading device 3. The reading device 3 reads the information I2, which may have been changed during the disconnection period. The predetermined information and the information which has been read, I1, I2, are compared in the comparison device 6 in order to determine how many bits have flipped.

The predetermined time period T may, for example, be determined by means of a counter or an RC element.

The decoupling is advantageously carried out once before the comparison. In principle, there is nothing against repeated decoupling in order to carry out the comparison after this. However, this procedure is more complex. In fact, the duration T of the time period during which the decoupling takes place is always predetermined, so that the environmental parameters can be deduced on the basis of the change in the information I2 which has been read in the predetermined time period T.

The number of bits which have flipped over in the predetermined time period T or the number of bits which are different after this time period T, is used to deduce the influence that the environmental parameters have had on the information loss effect.

If the chip has been cooled to a very major extent, for example in liquid nitrogen, the number of flipped bits is very small. It is considerably increased at high temperatures in comparison to the normal environmental temperature.

Other environmental parameters also act on the information loss effect. In particular, this includes radiation, for example X-ray radiation. The various effects, for example temperature and radiation, cannot, however, be considered in isolation, but have a combined influence on the information loss effect. The combination of these parameters can be detected on the basis of the rate at which the information loss progresses. This effect is used in a controlled manner and a measurement of the information loss effect is carried out in such a manner that this makes it possible to measure the environmental parameters which are influencing the information loss. The difference between the predetermined information and the information which has been read I1, I2 is a measure of the influencing environmental parameters. During normal operation, when the influence of radiation can largely be precluded, the difference is a measure of the temperature to which the random access memory 1 has been subjected.

Figure 2:
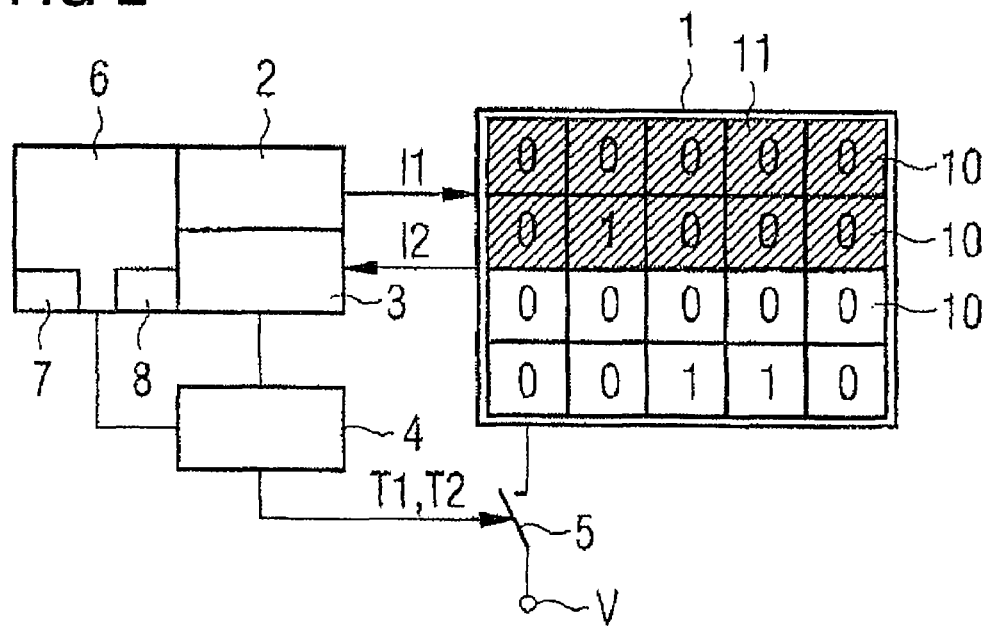
FIG. 2 shows a second exemplary embodiment of a circuit arrangement.

The so-called Hamming distance is used to determine the difference between the predetermined information I1 and the information which has been read, I2. This indicates the number of positions at which two binary sequences differ from one another. The Hamming distance between the sequence "00000 00000 00000 00000", as shown in the random access memory 1 in FIG. 1, and the sequence "00000 01000 00000 01100", as shown in the random access memory 1 in FIG. 2, is 3. The Hamming distance is a measure of the environmental parameters acting on the random access memory 1. All that is necessary in order to determine whether the environmental parameters, in particular the temperature range, are tolerable for operation of the circuit arrangement is to compare whether the measured Hamming distance is within a predetermined range.

If the Hamming distance is outside a predetermined range, then further operation of the circuit arrangement is inhibited.

The predetermined range is the maximum and minimum number of bits which flip over within an operating temperature range when the supply voltage V is decoupled for the predetermined time T. This temperature estimate is a rather coarse measure for determination of the temperature, but is adequate for operation of the circuit arrangement.

In the simplest case, the time period T is chosen such that no bits flip over below a predetermined maximum permissible temperature, so that the predetermined information I1 and the information which has been read I2 can be checked just to determine whether they are identical. This makes it possible to detect overheating.

FIG. 2 shows a further exemplary embodiment of the circuit arrangement. In order to avoid repetition, the following statements are restricted to differences from the already described exemplary embodiment.

The exemplary embodiment illustrated in FIG. 2 differs from the previous exemplary embodiment in that the comparison device 6 controls the decoupling of the supply voltage 5 from the random access memory, as is indicated by the coupling between the comparison device 6 and the switching device 4. The comparison device 6 is coupled to the switching device 4.

The decoupling is carried out in a plurality of steps until there is a predetermined relationship between the predetermined information I1 and the information which has been read I2. However, this relationship may in fact be reached even during the first step, so that there is no need for any further decoupling steps.

The process in this circuit arrangement determines how long the supply voltage V can be decoupled from the random access memory 1 in total so that the predetermined relationship exists between the predetermined information I1 and the information which has been read I2.

One possible procedure for operation of the circuit arrangement in this way comprises the predetermined information I1 first of all being written to the random access memory 1, or to at least an area 11 in the random access memory 1, as indicated by shading. Once the supply voltage V has been decoupled, a check is carried out to determine whether the predetermined relationship is satisfied. This procedure, including writing, decoupling and checking, is repeated, in each case with a different time period T1, T2 during which the power supply is decoupled, until the predetermined relationship is satisfied. In this case, the time period can be adapted with a predetermined step width or with a variable step width, depending on the extent to which the difference between the predetermined information I1 and the information which has been read I2 deviates from the predetermined relationship.

Another possible procedure for operation of the circuit arrangement comprises only the decoupling and checking being repeated. The writing process is carried out only once. This is an iterative method. The supply voltage V is interrupted in a plurality of decoupling steps, with the predetermined information and the information which has been read I1, I2 being compared after each decoupling step. The decoupling and the comparison are repeated until the predetermined relationship is satisfied. This means that the supply voltage V is decoupled repeatedly until a predetermined Hamming distance or a predetermined Hamming distance range has been detected. Because of the repetition steps, this method takes longer than the procedure described in FIG. 1. However, the accuracy is higher.

The switching device 4 can advantageously be driven by the comparison device 6 in such a manner that the time periods T1, T2 in each of which decoupling takes place become smaller as the desired Hamming weight is increasingly approached, in order to determine the overall time period as accurately as possible.

It is, of course, also possible to design the circuit arrangement in such a manner that it is possible to switch between the method in which the check is carried out once and in which the check is carried out a plurality of times, until the predetermined relationship is reached, in order to maximize the accuracy or the rate for given requirements.

The overall time period for which the supply voltage V must be decoupled, either in one step or in a plurality of steps, in order to satisfy the predetermined relationship is used as a measure for the influencing environmental parameters. If this time period is outside a predetermined range, which is provided by a means 8, for example a further memory unit 8, an alarm action is carried out.

FIGS. 3 and 4 show a third and fourth exemplary embodiment, respectively, in which the random access memory 1 is in the form of a DRAM. In order to avoid repetition, only the differences between exemplary embodiments in FIGS. 1 and 3 as well as between the exemplary embodiments in FIGS. 2 and 4 will be described in the following text. The supply voltage V for the DRAM 1 cannot be decoupled by the switching device 4, but feeds the random access memory 1 continuously. Furthermore, in the third and fourth exemplary embodiments, which are illustrated respectively in FIGS. 3 and 4, a refresh signal R is in each case provided, which is produced by the access device 2, 3 and can be coupled to the DRAM 1 in order to control regular refreshing (which is in principle required for this memory type) of the memory content by memory-internal circuits. If the provision of the refresh signal R is interrupted, the refreshing process ceases, and the stored information disappears.

The switching device 4 is designed to interrupt the provision of the refresh signal R, as is indicated by the switch 5, which is controlled by the switching device 4 and can interrupt the supply of the refresh signal R to the random access memory 1.

FIGS. 5 to 7 once again illustrate the method for operation of the circuit arrangement. The following description relates to the interruption of the supply voltage V by decoupling it. The statements can, of course, be transferred to the interruption of the refresh signal R.

Figure 5:
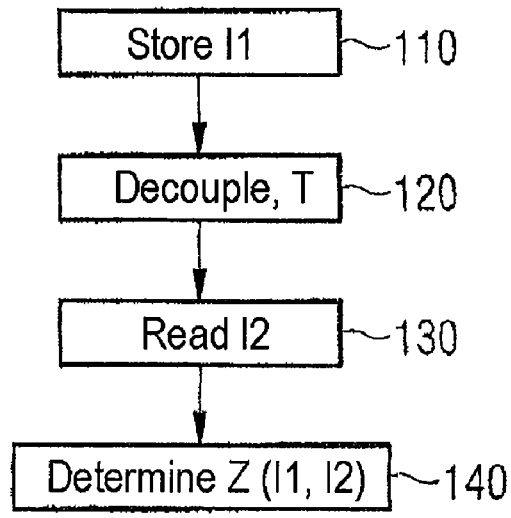
FIG. 5 shows a first method example.

FIG. 5 shows the procedure for the time-saving method. In the first step 110, the predetermined information I1 is stored in the random access memory 1. In the next step 120, the supply voltage V for the random access memory 1 is predetermined for a time period of predetermined duration T. In the next step 130, the information I2 is read from the random access memory, and the next step 140 is used to determine the extent to which the predetermined information I1 and the information which has been read I2 differ, as is indicated by the expression "Z(I1, I2)". The relationship Z(I1, I2), such as the Hamming distance between the predetermined information I1 and the information which has been read I2, is a measure of the environmental parameters to be detected.

Figure 6:
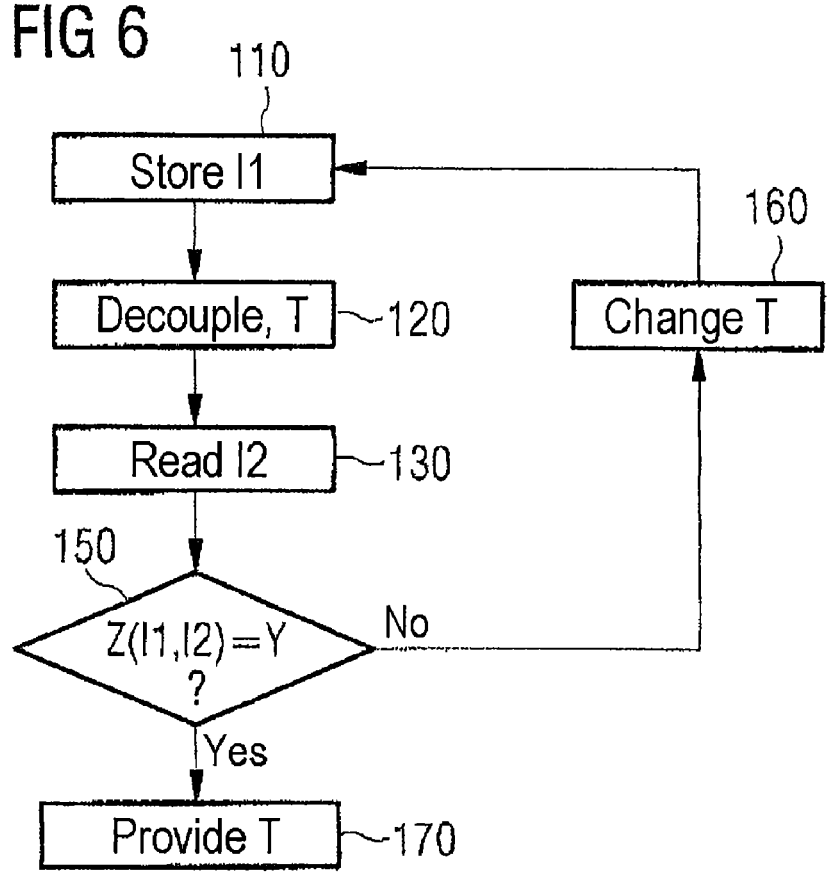
FIG. 6 shows a second method example.

FIG. 6 shows an exemplary embodiment of the method in which the steps 110, 120, 130 for storage, for decoupling and for reading are repeated. In this case, the duration T of the decoupling is changed with the step 160 for each repetition, which results in a change in the relationship Z(I1, I2) between the predetermined information I1 and the information which has been read I2. The abovementioned steps 110, 120, 130 are repeated until the relationship Z(I1, I2) between the predetermined information I1 and the information which has been read I2 corresponds to a predetermined relationship Y, as is indicated in block 150. The decoupling duration T which is used for this case is a measure of the environmental parameters to be detected.

FIG. 7 shows an exemplary embodiment of the method in which the steps 120, 130 for decoupling and for reading area repeated. In this case, there is no need to change the decoupling duration T, since every further decoupling step results in an additional change in the relationship Z(I1, I2) between the predetermined information I1 and the information which has been read I2. The abovementioned steps 120, 130 are repeated until the relationship Z(I1, I2) between the predetermined information I1 and the information from which has been read I2 corresponds to the predetermined relationship Y, as is indicated in block 150. The overall decoupling time Tg required before this situation occurs is a measure of the environmental parameters to be detected.

The detection process is advantageously carried out before the start of normal operation, so that the random access memory 1 is subsequently available again as a main memory. However, it is also feasible for the detection process also to be carried out during normal operation.

What is claimed is:

1. A method for operating a volatile random access memory as a detector, with predetermined information being stored in at least one area of the volatile random access memory, the method comprising:
   interrupting a supply voltage for the at least one area of the random access memory during a time period;
   reading information from the at least one area of the random access memory; and
   checking the extent to which the predetermined information and the information that has been read match or whether the predetermined information and the information which has been read have a predetermined relationship.

2. The method as claimed in claim 1, wherein the duration of the time period is predetermined.

3. The method as claimed in claim 2, further comprising repeating the interruption, reading, and checking steps until the predetermined information and the information which has been read have a predetermined relationship.

4. The method as claimed in claim 3, further comprising initiating an alarm action if the overall duration of the time periods of the interruption steps carried out is outside a predetermined range.

5. The method as claimed in claim 1, further comprising initiating an alarm action if the predetermined relationship is not satisfied.

6. The method as claimed in claim 1, further comprising repeating the storage, interruption, reading, and checking steps until the predetermined information and the information which has been read have a predetermined relationship, wherein the time period is changed for each interruption step.

7. The method as claimed in claim 6, further comprising initiating an alarm action if the duration of the time period in the most recently carried out interruption step is outside a predetermined range.

8. The method as claimed in claim 1, wherein the predetermined information and the information which has been read in each case comprises a binary data sequence and is determined during checking of the Hamming distance between the predetermined information and the information which has been read.

9. The method as claimed in claim 8, wherein a check is carried out to determine whether the Hamming distance is within a predetermined range.

10. A method for operating a volatile random access memory as a detector, with predetermined information being stored in at least one area of the volatile random access memory, the method comprising:
    interrupting the provision of a refresh signal retaining information for the at least one area of the random access memory during a time period;
    reading information from the at least one area of the random access memory; and
    checking the extent to which the predetermined information and the information that has been read match or whether the predetermined information and the information which has been read have a predetermined relationship.

11. The method as claimed in claim 10, wherein the duration of the time period is predetermined.

12. The method as claimed in claim 11, further comprising repeating the interruption, reading, and checking steps until the predetermined information and the information which has been read have a predetermined relationship.

13. The method as claimed in claim 12, further comprising initiating an alarm action if the overall duration of the time periods of the interruption steps carried out is outside a predetermined range.

14. The method as claimed in claim 10, further comprising initiating an alarm action if the predetermined relationship is not satisfied.

15. The method as claimed in claim 10, further comprising repeating the storage, interruption, reading, and checking steps until the predetermined information and the information which has been read have a predetermined relationship, wherein the time period is changed for each interruption step.

16. The method as claimed in claim 15, further comprising initiating an alarm action if the duration of the time period in the most recently carried out interruption step is outside a predetermined range.

17. The method as claimed in claim 10, wherein the predetermined information and the information which has been read in each case comprises a binary data sequence and is determined during checking of the Hamming distance between the predetermined information and the information which has been read.

18. The method as claimed in claim 17, wherein a check is carried out to determine whether the Hamming distance is within a predetermined range.

19. A circuit arrangement for operating a volatile random access memory as a detector, comprising:
    an access device, which is coupled to the random access memory, designed to store predetermined information in at least one area of the random access memory, and designed to read information from the at least one area of the random access memory;
    a switching device designed to decouple the at least one area of the random access memory from a supply voltage for a time period; and
    a comparison device, which is coupled to the access device, designed to check the extent to which the predetermined information and the information which has been read match, or designed to check whether the predetermined information and the information which has been read have a predetermined relationship, which is provided by a provision unit.

20. The circuit arrangement as claimed in claim 19, wherein the comparison device is designed to drive the switching device by decoupling the supply voltage until the predetermined information and the information which have been read have a predetermined relationship.

21. The circuit arrangement as claimed in claim 20, wherein the switching device is designed to carry out decoupling steps of predetermined duration until the predetermined information and the information which have been read have the predetermined relationship.

22. The circuit arrangement as claimed in claim 21, wherein the circuit arrangement is designed to carry out an alarm action if the total duration of the decoupling steps carried out is outside a predetermined range.

23. The circuit arrangement as claimed in claim 19, wherein the duration of the time period is predetermined.

24. The circuit arrangement as claimed in claim 19, wherein the circuit arrangement carries out an alarm action if the predetermined information and the information which has been read do not have the predetermined relationship.

25. The circuit arrangement as claimed in claim 24, wherein the comparison device is designed such that a check is carried out to determine whether the predetermined information and the information which has been read are the same.

26. The circuit arrangement as claimed in claim 19, wherein the predetermined information and the information which have been read each comprises a binary data sequence, and the comparison device is designed to determine the Hamming distance between the predetermined information and the information that has been read.

27. The circuit arrangement as claimed in claim 26, wherein the comparison device is designed to check whether the Hamming distance is within a predetermined range.

28. The circuit arrangement as claimed in claim 19, wherein the volatile random access memory can be decoupled from the supply voltage.

29. A circuit arrangement for operating a volatile random access memory as a detector, comprising:

an access device, which is coupled to the random access memory, designed to store predetermined information in at least one area of the random access memory, and designed to read information from the at least one area of the random access memory;

a signal generator designed to provide a refresh signal in order to retain the information in the at least one area of the random access memory, wherein the refresh signal can be coupled to the random access memory;

a switching device designed to deactivate the provision or the coupling of the refresh signal during a time period; and a comparison device, which is coupled to the access device, designed to check the extent to which the predetermined information and the information which has been read match, or to check whether the predetermined information and the information which has been read have a predetermined relationship, which is provided by a provision unit.

30. The circuit arrangement as claimed in claim 29, wherein the comparison device is designed to drive the switching device by decoupling the supply voltage until the predetermined information and the information which have been read have a predetermined relationship.

31. The circuit arrangement as claimed in claim 30, wherein the switching device is designed to carry out decoupling steps of predetermined duration until the predetermined information and the information which have been read have the predetermined relationship.

32. The circuit arrangement as claimed in claim 31, wherein the circuit arrangement is designed to carry out an alarm action if the total duration of the decoupling steps carried out is outside a predetermined range.

33. The circuit arrangement as claimed in claim 29, wherein the duration of the time period is predetermined.

34. The circuit arrangement as claimed in claim 29, wherein the circuit arrangement carries out an alarm action if the predetermined information and the information which has been read do not have the predetermined relationship.

35. The circuit arrangement as claimed in claim 34, wherein the comparison device is designed such that a check is carried out to determine whether the predetermined information and the information which have been read are the same.

36. The circuit arrangement as claimed in claim 29, wherein the predetermined information and the information which have been read each comprise a binary data sequence, and the comparison device is designed to determine the Hamming distance between the predetermined information and the information that has been read.

37. The circuit arrangement as claimed in claim 36, wherein the comparison device is designed to check whether the Hamming distance is within a predetermined range.

38. A circuit arrangement for operating a volatile random access memory as a detector, comprising:

an access means, which is coupled to the random access memory, for storing predetermined information in at least one area of the random access memory, and for reading information from the at least one area of the random access memory;

a switching means for decoupling the at least one area of the random access memory from a supply voltage for a time period; and a comparison means, which is coupled to the access means, for checking the extent to which the predetermined information and the information which has been read match, or for checking whether the predetermined information and the information which has been read have a predetermined relationship, which is provided by a provision means.

39. A circuit arrangement for operation a volatile random access memory as a detector, comprising:

an access means, which is coupled to the random access memory, for storing predetermined information in at least one area of the random access memory, and for reading information from the at least one area of the random access memory;

a signal generating means for providing a refresh signal in order to retain the information in the at least one area of the random access memory, wherein the refresh signal can be coupled to the random access memory;

a switching means for deactivating the provision or the coupling of the refresh signal during a time period; and a comparison means, which is coupled to the access means, for checking the extent to which the predetermined information and the information which has been read match, or for checking whether the predetermined information and the information which has been read have a predetermined relationship, which is provided by a provision means.

\* \* \* \* \*